(12) United States Patent
Liao et al.

(10) Patent No.: US 11,362,515 B2
(45) Date of Patent: Jun. 14, 2022

(54) ELECTROSTATIC DISCHARGE PROTECTION CIRCUIT HAVING FALSE-TRIGGER PREVENTION MECHANISM

(71) Applicant: REALTEK SEMICONDUCTOR CORPORATION, Hsinchu (TW)

(72) Inventors: Shih-Hsin Liao, Hsinchu (TW); Jyun-Ren Chen, Hsinchu (TW); Tay-Her Tsaur, Hsinchu (TW); Po-Ching Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/239,723

(22) Filed: Apr. 26, 2021

(65) Prior Publication Data
US 2022/0115865 A1 Apr. 14, 2022

(30) Foreign Application Priority Data

Oct. 8, 2020 (TW) .................................. 109135034

(51) Int. Cl.
*H02H 9/04* (2006.01)
*H01L 27/02* (2006.01)

(52) U.S. Cl.
CPC .......... *H02H 9/046* (2013.01); *H01L 27/0266* (2013.01)

(58) Field of Classification Search
CPC .............................. H02H 9/046; H01L 27/0266
USPC ........................................................... 361/56
See application file for complete search history.

(56) References Cited

U.S. PATENT DOCUMENTS

| 6,621,679 B1* | 9/2003 | Segervall | H01L 27/0292 361/111 |
|---|---|---|---|
| 7,372,679 B1* | 5/2008 | Ho | H02H 9/046 361/111 |
| 2006/0274466 A1* | 12/2006 | Rice | H01L 27/0266 361/56 |
| 2013/0100561 A1* | 4/2013 | Senouci | H02H 9/046 327/564 |
| 2014/0198415 A1* | 7/2014 | Schulmeyer | H02H 9/046 361/56 |
| 2017/0125085 A1* | 5/2017 | Kim | G11C 11/4074 |

(Continued)

*Primary Examiner* — Dharti H Patel
(74) *Attorney, Agent, or Firm* — WPAT, PC

(57) ABSTRACT

The present invention discloses an electrostatic discharge protection circuit having false-trigger prevention mechanism. A RC circuit, including an input control terminal, is coupled between an electrostatic discharge input terminal for receiving an input power and a ground terminal. An inverter includes a P-type transistor circuit, including P-type transistors coupled between the electrostatic discharge input terminal and an output control terminal in series and having an internal connection terminal between two of the P-type transistors, and an N-type transistor, coupled between the output control terminal and the ground terminal. Gates of the P-type and N-type transistors are controlled by the input control terminal A switch transistor, having the gate controlled by the input control terminal, is coupled between the internal connection terminal and the ground terminal. A discharging transistor having the gate controlled by the output control terminal, is coupled between the electrostatic discharge input terminal and the ground terminal.

10 Claims, 3 Drawing Sheets

(56) References Cited

U.S. PATENT DOCUMENTS

2019/0006842 A1\* 1/2019 Watanabe .............. H02H 9/046
2021/0083471 A1\* 3/2021 Watanabe .............. H02H 9/046

\* cited by examiner

ELECTROSTATIC DISCHARGE PROTECTION CIRCUIT HAVING FALSE-TRIGGER PREVENTION MECHANISM

BACKGROUND OF THE INVENTION

1. Field of the Invention

The present invention relates to an electrostatic discharge protection circuit having false-trigger prevention mechanism.

2. Description of Related Art

Electrostatic discharge (ESD) causes permanent damage to electronic components and equipments and affects functions of integrated circuits such that the products are unable to function normally.

Electrostatic discharge may occur during manufacturing, packaging, testing, storage and moving of the chips. In order to prevent the damage of the electrostatic discharge, the integrated circuit product can be equipped with an electrostatic discharge protection component or circuit and have a test performed thereon to enhance the protection of the integrated circuit from the electrostatic discharge and further increase the yield rate of the electronic products.

SUMMARY OF THE INVENTION

In consideration of the problem of the prior art, an object of the present invention is to supply an electrostatic discharge protection circuit having false-trigger prevention mechanism.

The present invention discloses an electrostatic discharge protection circuit having false-trigger prevention mechanism that includes a RC circuit, an inverter, a switch transistor and a discharging transistor. The RC circuit is electrically coupled between an electrostatic discharge input terminal and a ground terminal, and includes an input control terminal, wherein the electrostatic discharge input terminal is predetermined to be at a low state level and is configured to receive an input power. The inverter includes a P-type transistor circuit and an N-type transistor. The P-type transistor circuit includes a plurality of P-type transistors electrically coupled in series between the electrostatic discharge input terminal and an output control terminal, wherein two of the plurality of P-type transistors have an internal connection terminal therebetween. The N-type transistor is electrically coupled between the output control terminal and the ground terminal, wherein a gate of each of the P-type transistors and the N-type transistor is controlled by the input control terminal. The switch transistor is electrically coupled between the internal connection terminal and the ground terminal, wherein a gate of the switch transistor is controlled by the input control terminal. The discharging transistor is electrically coupled between the electrostatic discharge input terminal and the ground terminal, wherein a gate of the discharging transistor is controlled by the output control terminal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an electrostatic discharge protection circuit having false-trigger prevention mechanism to use the switch transistor to be turned on when the input control terminal of the RC circuit reaches a predetermined voltage level, to further turn off the P-type transistor circuit to prevent the increase of the voltage of the output control terminal. The electrostatic discharge mechanism provided by the discharging transistor is thus not falsely triggered.

Figure 1:
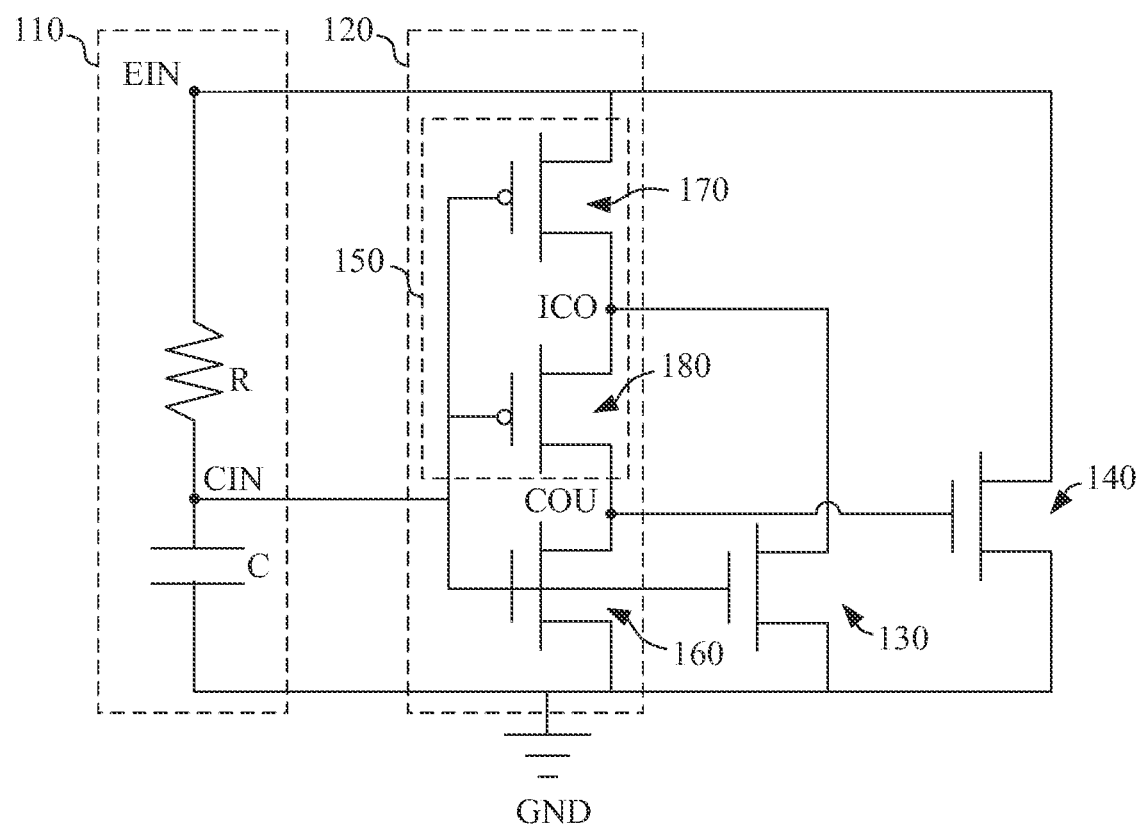
FIG. 1 illustrates a circuit diagram of an electrostatic discharge protection circuit having false-trigger prevention mechanism according to an embodiment of the present invention.

Reference is now made to FIG. 1. FIG. 1 illustrates a circuit diagram of an electrostatic discharge protection circuit 100 having false-trigger prevention mechanism according to an embodiment of the present invention. The electrostatic discharge protection circuit 100 includes a RC circuit 110, an inverter 120, a switch transistor 130 and a discharging transistor 140.

The RC circuit 110 is electrically coupled between an electrostatic discharge input terminal EIN and a ground terminal GND and includes an input control terminal CIN. The RC circuit 110 includes a resistor R and a capacitor C. The resistor R is electrically coupled between the electrostatic discharge input terminal EIN and the input control terminal CIN. The capacitor C is electrically coupled between the input control terminal CIN and the ground terminal GND.

In different embodiments, the resistor R includes such as, but not limited to one of a conventional resistor, a transistor resistor, a poly-silicon resistor and an N-well resistor. The capacitor C includes such as, but not limited to one of a MOS transistor capacitor, a metal-oxide metal (MOM) capacitor and a metal insulator metal (MIM) capacitor. However, the present invention is not limited thereto.

The inverter 120 includes a P-type transistor circuit 150 and an N-type transistor 160. The P-type transistor circuit 150 includes a P-type transistor 170 and a P-type transistor 180 electrically coupled in series and electrically coupled between the electrostatic discharge input terminal EIN and an output control terminal COU. The P-type transistor 170 and the P-type transistor 180 include an internal connection terminal ICO therebetween. The N-type transistor 160 is electrically coupled between the output control terminal COU and the ground terminal GND. The gates of the P-type transistor 170, the P-type transistor 180 and the N-type transistor 160 are controlled by the input control terminal CIN.

The switch transistor 130 is electrically coupled between the internal connection terminal ICO and the ground terminal GND. The discharging transistor 140 is electrically coupled between the electrostatic discharge input terminal EIN and the ground terminal GND. The gate of the switch transistor 130 is controlled by the output control terminal CIN. The gate of the discharging transistor 140 is controlled by the output control terminal COU. In the present embodiment, each of the switch transistor 130 and the discharging transistor 140 is a single N-type transistor, such as but not limited to an NMOS transistor or an NPN BJT transistor.

The operation of the electrostatic discharge protection circuit 100 is further described in detail in the following paragraphs.

Figure 2:
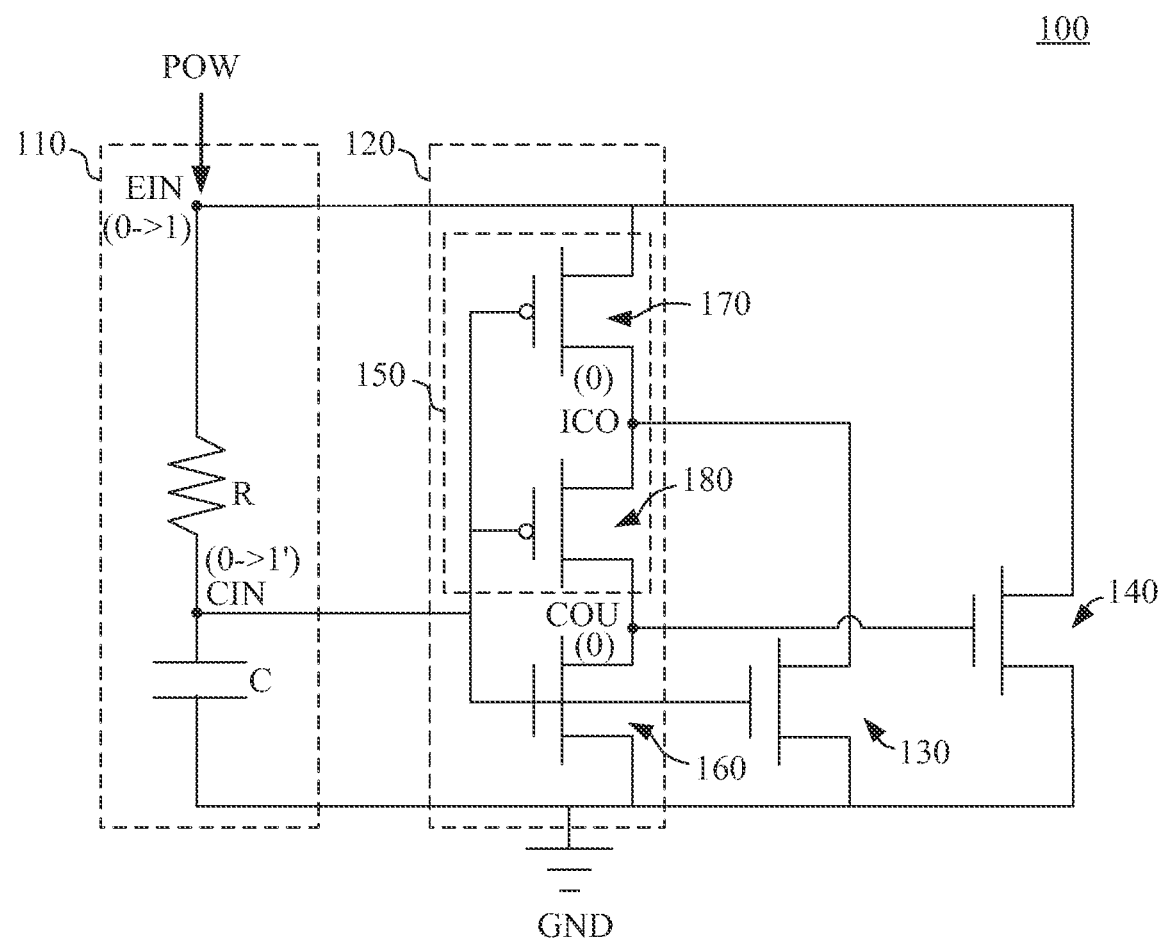
FIG. 2 illustrates a circuit diagram of the electrostatic discharge protection circuit when an input power is received according to an embodiment of the present invention.

Reference is now made to FIG. 2. FIG. 2 illustrates a circuit diagram of the electrostatic discharge protection circuit 100 when an input power POW is received according to an embodiment of the present invention.

When the electrostatic discharge input terminal EIN does not receive the input power POW yet, a voltage level of the electrostatic discharge input terminal EIN is at a low state level. Under such a condition, the RC circuit 110 electrically coupled to the electrostatic discharge input terminal EIN makes a voltage level of the input control terminal CIN to be at the low state level since the voltage level of the electrostatic discharge input terminal EIN is at the low state level.

When the electrostatic discharge input terminal EIN receives the input power POW, the voltage level of the electrostatic discharge input terminal EIN rises from the low state level to a high state level (marked as 0→1 in FIG. 2). In an embodiment, it takes a several hundreds of microseconds (μs) for the input power POW to raise the voltage level of the electrostatic discharge input terminal EIN to the high state level.

Under such a condition, the RC circuit 110 makes the voltage level of the input control terminal CIN rise from the low state level to a voltage level lower than the high state level within a predetermined time (marked as 0→1' in FIG. 2). More specifically, though the resistor R of the RC circuit 110 is electrically coupled to the electrostatic discharge input terminal EIN, it takes time to charge the capacitor C so as to raise the voltage level of the input control terminal CIN. Therefore, the voltage level of the input control terminal CIN does not rise synchronously with the increase of the voltage level of the electrostatic discharge input terminal EIN. In an embodiment, the predetermined time is determined by a time constant of the resistor R and the capacitor C.

Since the voltage level of the input control terminal CIN rises from the low state level within the predetermined time, the input control terminal CIN that has the low state level turns on the P-type transistor 170 electrically coupled between the electrostatic discharge input terminal EIN and the internal connection terminal ICO. The turned-on P-type transistor 170 makes the electrostatic discharge input terminal EIN charge the internal connection terminal ICO.

When the input control terminal CIN rises to the voltage level lower than the high state level (which is 1' between the low state level and the high state level), the switch transistor 130 is turned on to discharge the internal connection terminal ICO. Under such a condition, the voltage level of the internal connection terminal ICO drops to the low state level (marked as 0 in FIG. 2) so as to turn off the P-type transistor 180 electrically coupled between the internal connection terminal ICO and the output control terminal COU.

More specifically, the voltage difference between the source and the gate of the P-type transistor 180 is insufficient to turn on the P-type transistor 180 due to the decreasing of the voltage level of the internal connection terminal ICO. The P-type transistor 180 remains to be under the turn-off state accordingly.

The turned-off of P-type transistor 180 makes the electrostatic discharge input terminal EIN unable to charge the output control terminal COU through the P-type transistor 180. The voltage level of the output control terminal COU remains to be at the low state level (marked as 0 in FIG. 2). Further, the discharging transistor 140 is turned off and the electrostatic discharge input terminal EIN cannot be discharged.

Figure 3:
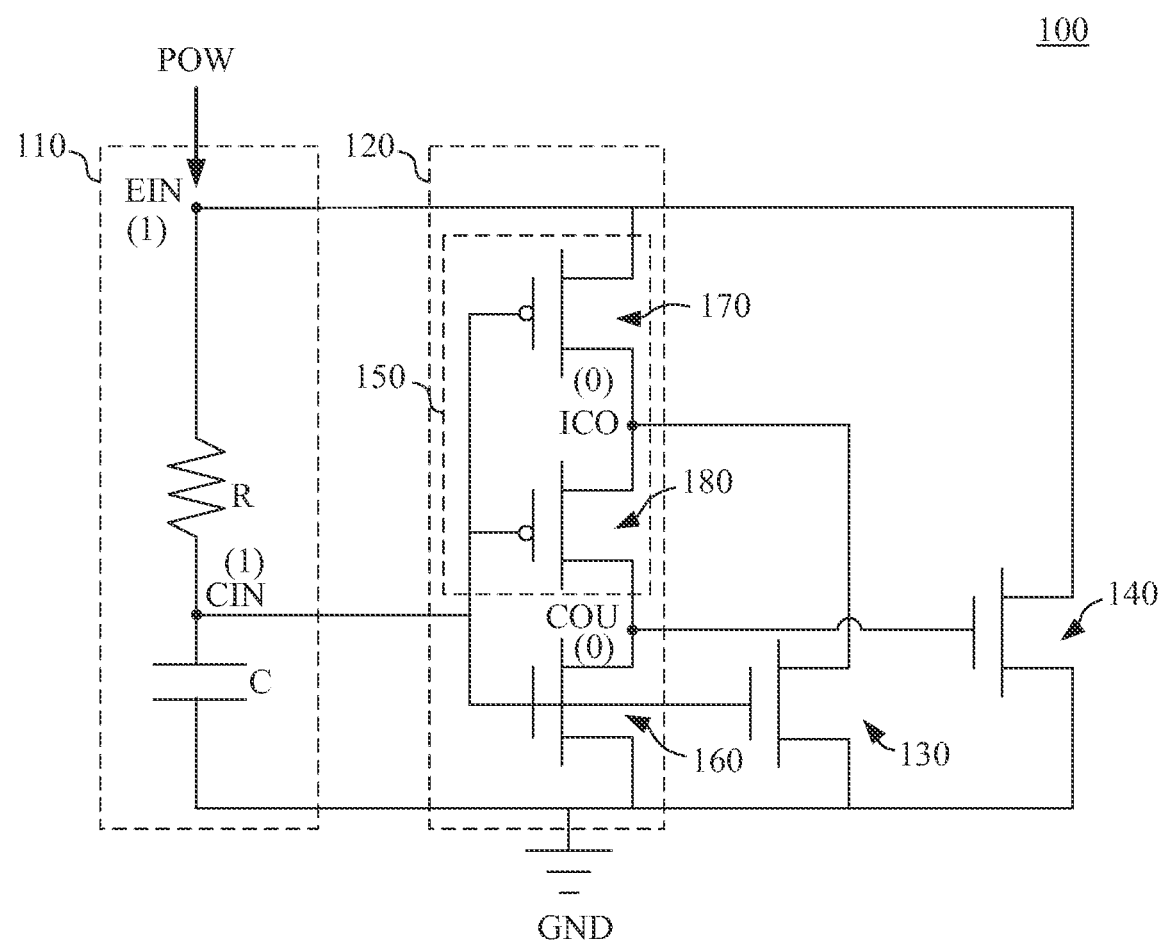
FIG. 3 illustrates a circuit diagram of the electrostatic discharge protection circuit when the voltage level of the input control terminal rises to the high state level according to an embodiment of the present invention.

Reference is now made to FIG. 3. FIG. 3 illustrates a circuit diagram of the electrostatic discharge protection circuit 100 when the voltage level of the input control terminal CIN rises to the high state level according to an embodiment of the present invention.

When the input control terminal CIN rises to the high state level (marked as 1 in FIG. 2) after the predetermined time, the input control terminal CIN turns off the P-type transistor 170 and the P-type transistor 180, and turns on the N-type transistor 160. As a result, the internal connection terminal ICO and the output control terminal COU remain to be at the low state level (labeled as 0 in FIG. 2) so as to turn off the discharging transistor 140.

In the electrostatic discharge protection circuit 100, when the electrostatic discharge input terminal EIN receives the electrostatic discharge pulse within a few nanoseconds (ns), the voltage level of the input control terminal CIN temporarily stays at the low state level since the response time of the RC circuit 110 is much longer than the increase of the voltage generated due to the electrostatic discharge pulse. The input control terminal CIN is thus able to trigger the inverter 120 to generate the high state level at the output control terminal COU to turn on the discharging transistor 140 to discharge the electrostatic discharge input terminal EIN.

In some approaches, the switch transistor is absent. When the electrostatic discharge input terminal EIN receives the input power POW, the low state level of the input control terminal CIN turns on the P-type transistor of the inverter to charge the output control terminal COU. However, the process that the voltage of the input control terminal CIN rises to the high state level is too slow to turn on the N-type transistor of the inverter. As a result, the voltage of the output control terminal COU increases accordingly such that the discharging transistor 140 is falsely triggered to discharge the input power POW, which is not electrostatic discharge pulse.

As a result, the electrostatic discharge protection circuit 100 of the present invention uses the switch transistor 130 to be turned on when the input control terminal CIN of the RC circuit 120 rises to the voltage level that is lower than the high state voltage level (i.e., the voltage level 1' illustrated in FIG. 2), so as to discharge the internal connection terminal ICO of the P-type transistor circuit 150 to further turn off the P-type transistor 180 disposed between the internal connection terminal ICO and the output control terminal COU. Such a mechanism prevents the voltage of the output control terminal COU from rising. The discharging transistor 140 thus does not discharge the input power POW.

In an embodiment, the switch transistor 130 may have a threshold voltage lower than the threshold voltage of the N-type transistor 160 by having a difference size. As a result, the switch transistor 130 can be turned on when the voltage level of the input control terminal CIN rises to the voltage level that is lower than the high state level. On the contrary, the N-type transistor 160 only turns on when the voltage level of the input control terminal CIN rises to the high state level.

It is appreciated that part of the components in the embodiment described above can be replaced by other components under the condition that the operation of the electrostatic discharge protection circuit is not affected. For example, in an embodiment, the switch transistor 130 can be a P-type transistor electrically coupled to the output control terminal COU through an additional inverter (not illustrated). The P-type transistor can be such as, but not limited to a PMOS transistor or a PNP BJT transistor.

Similarly, in an embodiment, the discharging transistor 140 can be a P-type transistor electrically coupled to the output control terminal COU through an additional inverter (not illustrated in the figure). The P-type transistor can be such as, but not limited to a PMOS transistor or a PNP BJT transistor.

Besides, in an embodiment, the switch transistor 130 may include a plurality of N-type transistors or P-type transistors electrically coupled in series and all controlled by the input control terminal CIN.

Further, in the embodiment of FIG. 1, the number of the P-type transistors included in the P-type transistor circuit 150 is two. However, in other embodiments, the number of the P-type transistors included in the P-type transistor circuit 150 can be any number that is equal to or larger than two. The internal connection terminal can be disposed in any two neighboring P-type transistors.

It is appreciated that the embodiments described above are merely an example. In other embodiments, it is appreciated that many modifications and changes may be made by those of ordinary skill in the art without departing, from the spirit of the invention.

In summary, the electrostatic discharge protection circuit having false-trigger prevention mechanism uses the switch transistor to be turned on when the input control terminal of the RC circuit reaches a predetermined voltage level to further turn off the P-type transistor circuit to prevent the increase of the voltage of the output control terminal. The electrostatic discharge mechanism provided by the discharging transistor is thus not falsely triggered.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An electrostatic discharge protection circuit having false-trigger prevention mechanism, comprising:
    a RC circuit electrically coupled between an electrostatic discharge input terminal and a ground terminal, and comprising an input control terminal, wherein the electrostatic discharge input terminal is predetermined to be at a low state level and is configured to receive an input power;
    an inverter comprising:
        a P-type transistor circuit, comprising a plurality of P-type transistors electrically coupled in series between the electrostatic discharge input terminal and an output control terminal, wherein two of the plurality of P-type transistors have an internal connection terminal therebetween; and
        an N-type transistor electrically coupled between the output control terminal and the ground terminal, wherein a gate of each of the plurality of P-type transistors and the N-type transistor is controlled by the input control terminal;
    a switch transistor electrically coupled between the internal connection terminal and the ground terminal, wherein a gate of the switch transistor is controlled by the input control terminal; and
    a discharging transistor electrically coupled between the electrostatic discharge input terminal and the ground terminal, wherein a gate of the discharging transistor is controlled by the output control terminal.

2. The electrostatic discharge protection circuit of claim 1, wherein when the electrostatic discharge input terminal receives an input power, a voltage level of the electrostatic discharge input terminal rises from the low state level to a high state level such that a voltage level of the input control terminal rises from the low state level to a voltage level lower than the high state level within a predetermined time;
    wherein within the predetermined time, the low state level of the input control terminal makes at least one of the plurality of P-type transistors electrically coupled between the electrostatic discharge input terminal and the internal connection terminal turn on;
    wherein the switch transistor is turned on according to the voltage level lower than the high state level to discharge the internal connection terminal to make at least one of the plurality of P-type transistors electrically coupled between the internal connection terminal and the output control terminal turn off.

3. The electrostatic discharge protection circuit of claim 2, wherein the output control terminal is maintained to be at the low state level since the plurality of P-type transistors electrically coupled between the internal connection terminal and the output control terminal is turned off such that the discharging transistor turns off.

4. The electrostatic discharge protection circuit of claim 2, wherein the input control terminal rises to the high state level after the predetermined time such that the plurality of P-type transistors are turned off and the N-type transistor is turned on, and the output control terminal is maintained to be at the low state level such that the discharging transistor turns off.

5. The electrostatic discharge protection circuit of claim 1, wherein the RC circuit comprises:
    a resistor electrically coupled between the electrostatic discharge input terminal and the input control terminal; and
    a capacitor electrically coupled between the input control terminal and the ground terminal;
    wherein the predetermined time is determined by a time constant of the resistor and the capacitor.

6. The electrostatic discharge protection circuit of claim 5, wherein the resistor comprises one of a transistor resistor, a poly-silicon resistor and an N-well resistor.

7. The electrostatic discharge protection circuit of claim 5, wherein the capacitor comprises one of a MOS transistor capacitor, a metal-oxide metal capacitor and a metal insulator metal capacitor.

8. The electrostatic discharge protection circuit of claim 1, wherein the discharging transistor comprises an N-type transistor or a P-type transistor electrically coupled to the output control terminal through an additional inverter.

9. The electrostatic discharge protection circuit of claim 1, wherein the switch transistor comprises an N-type transistor or a P-type transistor electrically coupled to the output control terminal through an additional inverter.

10. The electrostatic discharge protection circuit of claim 1, wherein the switch transistor comprises a plurality of transistors electrically coupled in series.

* * * * *